(12) United States Patent
Cappabianca et al.

(10) Patent No.: US 10,102,962 B1
(45) Date of Patent: Oct. 16, 2018

(54) INTEGRATED MAGNETIC PASSIVE DEVICES USING MAGNETIC FILM

(71) Applicant: Apple Inc., Cupertino, CA (US)

(72) Inventors: David P. Cappabianca, Gilroy, CA (US); Zhitao Cao, Campbell, CA (US); Kwan-Yu Lai, Campbell, CA (US)

(73) Assignee: Apple Inc., Cupertino, CA (US)

( * ) Notice: Subject to any disclaimer, the term of this patent is extended or adjusted under 35 U.S.C. 154(b) by 14 days.

(21) Appl. No.: 15/163,909

(22) Filed: May 25, 2016

Related U.S. Application Data

(60) Provisional application No. 62/221,835, filed on Sep. 22, 2015.

(51) Int. Cl.
| | | |
|---|---|---|
| *H01F 17/06* | (2006.01) | |
| *H01F 27/02* | (2006.01) | |
| *H05K 7/10* | (2006.01) | |
| *H01F 27/28* | (2006.01) | |
| *H01F 27/29* | (2006.01) | |
| *H01F 27/32* | (2006.01) | |
| *H01F 41/10* | (2006.01) | |
| *H05K 1/18* | (2006.01) | |

(52) U.S. Cl.
CPC ......... *H01F 27/2823* (2013.01); *H01F 27/29* (2013.01); *H01F 27/32* (2013.01); *H01F 41/10* (2013.01); *H05K 1/181* (2013.01); *H05K 2201/1003* (2013.01)

(58) Field of Classification Search
CPC .......... H01F 27/28; H01F 27/29; H01F 27/32; H01F 21/00; H01F 19/00; H01F 17/00; H01F 41/10; H01F 2029/143; H01F 2038/143; H05K 1/08
USPC .......... 361/767; 336/83, 146, 192, 200, 155, 336/175, 232
See application file for complete search history.

(56) References Cited

U.S. PATENT DOCUMENTS

| | | | | |
|---|---|---|---|---|
| 1,794,717 A | * | 3/1931 | Lindenblad | H03C 1/10 332/173 |
| 6,822,548 B2 | | 11/2004 | Wang | |
| 7,023,313 B2 | * | 4/2006 | Sutardja | H01F 3/10 29/602.1 |
| 7,026,905 B2 | | 4/2006 | Haugs | |
| 7,196,514 B2 | * | 3/2007 | Li | G01R 33/04 324/244 |
| 7,362,206 B1 | * | 4/2008 | Herbert | H01F 29/02 336/220 |
| 8,269,592 B1 | * | 9/2012 | McCauley, IV | H01F 27/28 336/175 |
| 2003/0080845 A1 | * | 5/2003 | Fontanella | H01F 17/0006 336/200 |

* cited by examiner

*Primary Examiner* — Mangtin Lian
(74) *Attorney, Agent, or Firm* — Meyertons, Hood, Kivlin, Kowert & Goetzel, P.C.

(57) ABSTRACT

An inductive device is disclosed, including a first wire coupled to a first terminal and to a second terminal, a non-conductive material surrounding the first wire, and a magnetic film. The non-conductive material spans the region from the first terminal to the second terminal. The magnetic film surrounds at least a portion of the non-conductive material between the first terminal and the second terminal. The first wire has a first amount of inductance.

13 Claims, 16 Drawing Sheets

US 10,102,962 B1

INTEGRATED MAGNETIC PASSIVE DEVICES USING MAGNETIC FILM

PRIORITY CLAIM

This application claims the benefit of U.S. Provisional Patent Application No. 62/221,835, filed on Sep. 22, 2015, and whose disclosure is incorporated herein by reference.

BACKGROUND

Technical Field

Embodiments described herein are related to the field of magnetic passive circuit components. More particularly, these embodiments relate to a structure for and method of building inductive devices.

Description of the Related Art

Magnetic devices, such as, for example, inductors, may be used in a variety of circuits. Inductors may be used to resist fluctuations of an electric current. The current stabilizing property of inductors makes them useful in power supply circuits and voltage regulating circuits, helping to generate low noise power signals. Inductors may also be used in wireless circuits, particularly as part of an antenna circuit.

Inductor designs may be large and/or expensive when compared to other circuit components. Due to this, some electronic devices, in particular, small portable devices such as smartphones, for example, may use a minimal number of inductors to save space and cost. Limiting a number of inductors may result in more complex circuit designs with reduced performance. An inductor design and manufacturing method are desired which are low cost and small sized.

SUMMARY OF THE EMBODIMENTS

Various embodiments of an inductive device are disclosed. Broadly speaking, an inductive device, a method for creating the inductive device, and a system utilizing the inductive device are disclosed. An embodiment of the inductive device includes a first wire coupled to a first terminal and to a second terminal, a non-conductive material surrounding the first wire, and a magnetic film. The non-conductive material spans a region between the first terminal and the second terminal. The magnetic film surrounds at least a portion of the non-conductive material between the first terminal and the second terminal. The first wire has a first amount of inductance.

In a further embodiment, a second wire is surrounded by the non-conductive material and is parallel to the first wire. The non-conductive material is further configured to fill space between the second wire and the magnetic film and between the second wire and the first wire.

In another embodiment, the second wire is coupled to a third terminal and to a fourth terminal. In one embodiment, the first amount of inductance is modified dependent upon a current through the second wire between the third terminal and the fourth terminal.

In a further embodiment, a shape of a cross-section of the magnetic film, perpendicular to the first and second wires, is a figure-eight shape. In an embodiment, the first wire and the second wire are twisted around each other such that the first terminal and the fourth terminal are on a same side of the inductive device. In another embodiment, a second wire is coiled around the magnetic film and coupled to a third terminal and to a fourth terminal.

BRIEF DESCRIPTION OF THE DRAWINGS

The following detailed description makes reference to the accompanying drawings, which are now briefly described.

Figure 1:
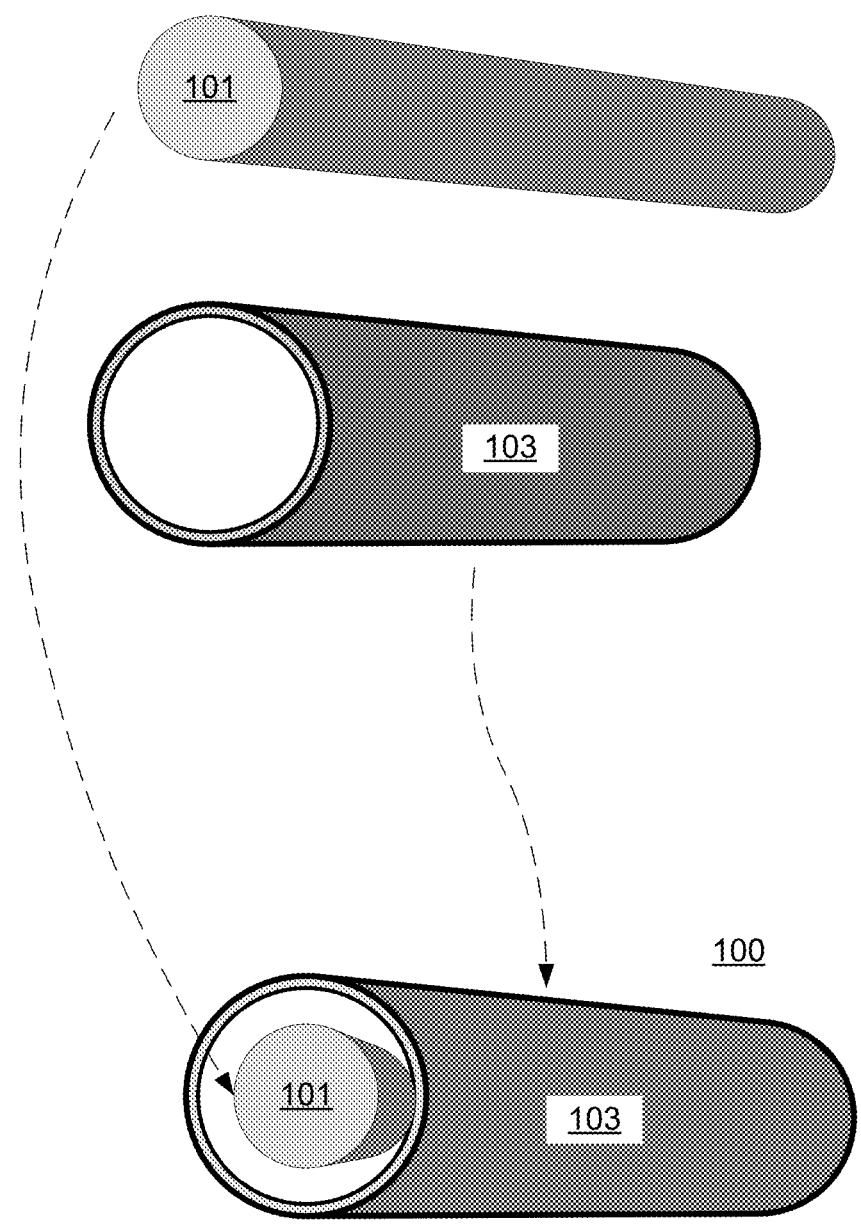
FIG. 1 illustrates components of an embodiment of an inductor.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION

Due to size and cost restraints, inductors may be underutilized in small portable electronics. Inductors can improve the performance of some power supply, voltage regulation, wireless, and current regulation designs. Advantages, therefore, may exist in having an inductor design that is small and cost efficient. In some embodiments, it may be advantageous to include one or more inductive devices coupled to an integrated circuit (IC) within the packaging of the IC, thereby freeing space on a circuit board.

It is noted that an "inductor" refers to an electronic component that resists changes in current flowing through it. As current flows through an inductor, some energy resulting from the flow of current is temporarily stored in a magnetic field. When current passing through the inductor changes, the resulting change in the magnetic field induces a voltage in the inductor, which opposes the change in current. The amount of the opposition to current changes imparted by the magnetic field is characterized by a ratio of the voltage to the rate of change of the current, which is commonly referred to as inductance. Inductors may be employed in a variety of circuit applications and may be constructed using various manufacturing methods in order to achieve a desired inductance value.

Moving to FIG. 1, components of an embodiment of an inductor are illustrated. Wire 101 and magnetic tube 103 may be used to create inductor 100. Wire 101 is placed inside magnetic tube 103, without touching one another. A non-conductive material, such as, but not limited to, glass, rubber, or plastic, may be used to fill the space between wire 101 and magnetic tube 103, providing support for wire 101 and isolating the two components. A magnetic field generated by magnetic tube 103 increases an amount of inductance in wire 101. Each end of wire 101 may be coupled to a respective node of a circuit, thereby adding the inductance to signals transmitted between these respective nodes. In some embodiments, terminals may be coupled to each end of wire 101, providing connection points from inductor 100 to circuit nodes.

Wire 101 may consist of any suitable conductive material, such as, but not limited to, gold, copper, aluminum, and the like. In some embodiments, a glass, rubber, or plastic coating may be included around the wire as an isolator from other conductive materials. Magnetic tube 103 may consist of any suitable compound, including, but not limited to, materials made with iron, cobalt, or nickel. The amount of inductance in wire 101 may be determined based on several properties of inductor 100, including, but not limited to, the length and diameter of magnetic tube 103, the diameter of wire 101, the distance between the outer surface of wire 101 and the inner surface of magnetic tube 103, and the materials used in wire 101 and magnetic tube 103.

It is noted that inductor 100 of FIG. 1 is merely an example for demonstration of disclosed concepts. Some operational details have been omitted to focus on the disclosed subject matter. Other embodiments may include more components.

Figure 2:
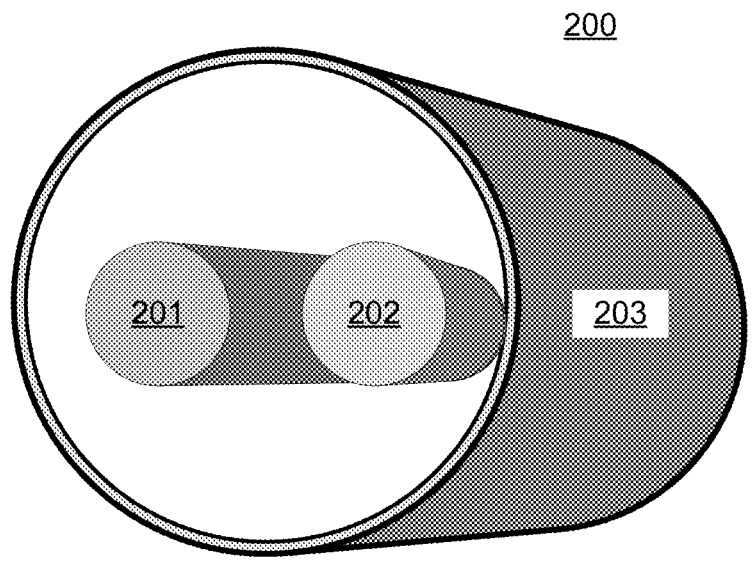
FIG. 2 depicts two embodiments of an inductor.
Figure 2:
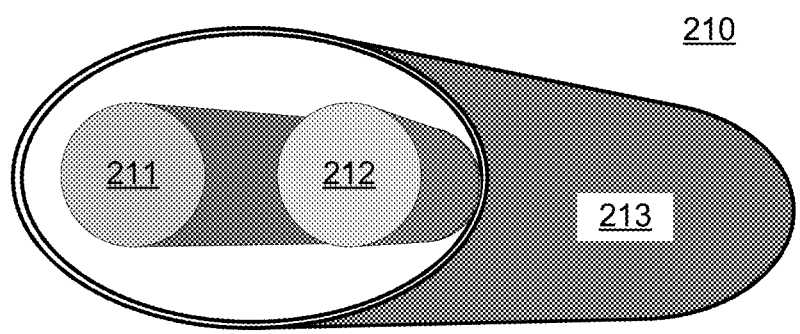

Turning to FIG. 2, two embodiments of a structure for an inductor are shown. Inductor 200 is similar to inductor 100 in FIG. 1, with the addition of wire 202, forming a two-conductor inductor. Inductor 210 is similar to inductor 200, except that the shape of the cross section of magnetic tube 213 is oval rather than circular. In some embodiments, the shape may approximate an elliptical shape with each of the two wires located near each focal point of the ellipse.

Wire 201 and wire 202 may be similar in composition to wire 101 in FIG. 1. In the present embodiment, wires 201 and 202 are parallel to each other and to magnetic tube 203 and therefore do not come into contact with one another. Similar to inductor 100, magnetic tube 203 imparts an inductance on both wire 201 and wire 202. Wires 201 and 202 are conductively isolated from each other, but are inductively coupled. A current running through wire 201 may increase or decrease the inductance on wire 202, and vice versa. If currents in each wire are in the same direction, then an amount of inductance may be increased on each wire. Conversely, if the currents are in opposite directions, then the amount of inductance may be decreased in each wire.

In the embodiment of inductor 210, magnetic tube 213 has an oval (or elliptical) cross section rather than circular. Use of an oval shape can reduce a height of inductor 210 as compared with inductor 200. Additionally, the oval shape may increase the amount of inductance on wires 211 and 212 by bringing the magnetic material, and therefore the magnetic field, closer to the wires. In some embodiments, the oval shape may allow for a higher inductance value while using less material to create magnetic tube 213.

It is noted that inductor 200 and inductor 210 in FIG. 2 are merely examples. In other embodiments, additional components may be included, such as, for example, non-conductive coatings around each of wires 201, 202, 211, and/or 212.

Figure 3:
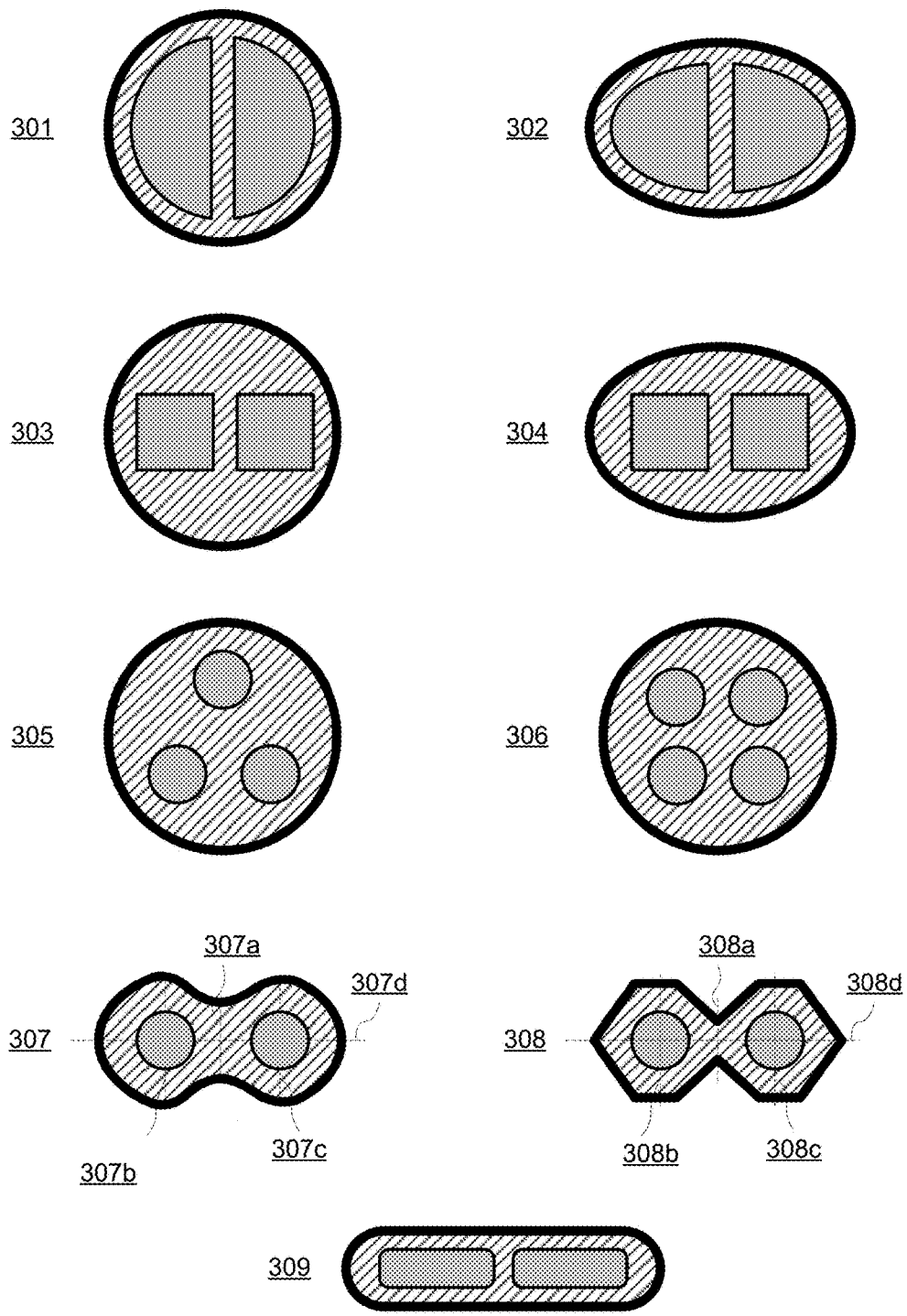
FIG. 3 illustrates several embodiments of inductors with various geometries.

Moving to FIG. 3 cross sections for nine embodiments of structures for inductors are illustrated, each with a different geometry of components. The illustrated cross sections are formed perpendicular to the length of the wires. The cross-hatched area represents non-conductive material. Inductors 301, 302, 303, and 304 illustrate various embodiments for the shape of two wires running through the two previously discussed magnetic tube shapes. Inductor 301 shows a circular magnetic tube with two semi-circular wires. The amount of space between the wires and the inside of the magnetic tube is reduced in comparison to inductor 200 of FIG. 2. The flat sides of each of the wires provide a large surface area between the two wires, creating a higher level of inductive coupling as compared to the two circular wires of inductor 200. Furthermore, the round portions of each wire allow for a greater amount of inductance to be coupled from the magnetic tube. The structure of inductor 301 may allow for similar amount of inductance in a smaller overall package as compared to inductor 200. Inductor 302 utilizes similarly shaped wires as inductor 301, but places them in an elliptical magnetic tube rather than a circular one. The semielliptical wires provide similar characteristics as the semicircular wires in inductor 301. The elliptical shape of the magnetic tube may provide for a lower height as compared to inductor 301 while providing similar amounts of inductance.

In the embodiment of inductors 303 and 304, the cross section of each of the two wires is square rather than circular. Compared to circular wires, the adjacent flat sides of the two wires may allow a higher level of inductive coupling between the wires. The square shape may also be easier to manufacture in some embodiments. The square shape, may, however, result in non-uniform amounts of inductance across the wires. For example, the amount of inductance experienced by current running at the corners of the wires may be different than the amount experienced by current running along the centers of the sides. Differences between the circular (inductor 303) and elliptical (inductor 304) magnetic tubes correspond to the previously description above.

Inductors 305 and 306 each include more than two wires within the magnetic tubes. In these embodiments, one or more of the wires may be used for active signals while any unused wires may be used as control signals. As used herein, an "active signal" refers to a signal to which the inductance of an inductor is to be applied. A "control signal" refers to a signal used to modify an amount of inductance applied to the active signal. In some embodiments, one active signal may be coupled to two or more wires, for example, to reduce an amount of resistance applied to the active signal. A same control signal may be coupled to two or more wires to increase an influence of the control signal on the active signal.

The embodiment of inductor 307 includes a magnetic tube with indentions on the top and bottom occurring between the two illustrated wires. As illustrated in the cross section of inductor 307, a shortest distance across the magnetic tube between the two wires (as indicated by line 307a) is less than a distance across the magnetic tube through the center of either wire (as indicated by lines 307b and 307c). As used herein, "across the magnetic tube" refers to a path between two points of the magnetic tube that crosses an imaginary line running through the center point of each wire (as indicated by line 307d). This shape may be referred to as a "figure-eight" or a "dual divot" cross sectional shape. The figure-eight shape may be used in some embodiments, to increase the level of inductance on the two wires by bringing more of the inner surface of the magnetic tube closer to each of the two wires. In other words, a distance from any point on the outer surface of each wire to the closest point on the inner surface of the magnetic tube may be kept more consistent than corresponding distances in inductors 200 and 210 in FIG. 2. The figure-eight shape may also, in some embodiments, decrease inductive coupling between the two wires, thereby reducing an impact of a signal on a first of the two wires on an inductance of a second of the two wires.

Similar to inductor 307, inductor 308 is another embodiment of a dual-divot shape. The magnetic tube of inductor 308 has flat sides, rather than the curved sides shown in other inductors of FIG. 3. The shape of inductor 308 may resemble two overlapping hexagons. As described for inductor 307, a shortest distance across the magnetic tube between the two wires (as indicated by line 308a) is less than a distance across the magnetic tube through the center of either wire (as indicated by lines 308b and 308c). Consequently, inductor 308 may also increase the level of inductance on the two wires by bringing more of the inner surface of the magnetic tube closer to each of the two wires, and may also decrease inductive coupling between the two wires. The flat surfaces of the magnetic tube may be easier to generate by some manufacturing processes. The flat surfaces may also provide some benefits for attaching inductor 308 to a circuit board or to an IC die.

Inductor 309 includes two flat ribbon wires and a magnetic tube with a similar wide, flat shape. In some embodiments, the wide flat shape may provide advantages, such as in applications in which height above components is limited, such as, for example, very thin portable electronics. The flat design of inductor 309 may also be advantageous for including in a multi-chip package, for example, when attached to the top of an IC die.

It is noted that embodiments illustrated in FIG. 3 are example structures intended to demonstrate particular aspects of the disclosed subject matter. Additional structures are contemplated, including combinations of the illustrated structures. The illustrated embodiments are not intended to convey relative sizes of the components. For example, although the wires in each embodiment are shown as being relatively equal in size and shape, in some embodiments, wires of different sizes or shapes may be used.

Figure 4:
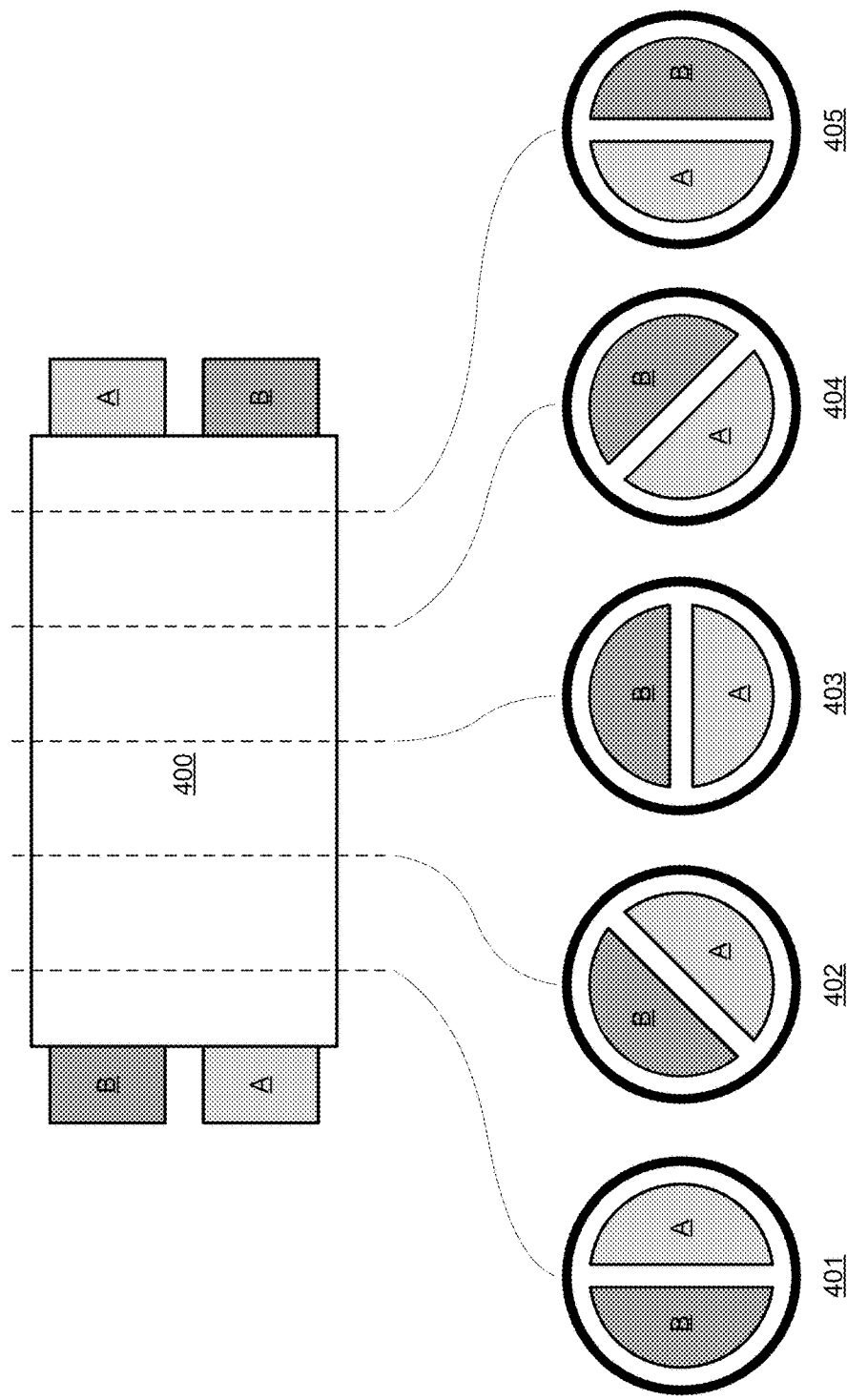
FIG. 4 illustrates an embodiment of an inductor with two twisted wires.

Turning now to FIG. 4, an embodiment of an inductor with two twisted wires is shown. Inductor 400 is illustrated from a top-down view, including two wires labeled A and B. Note that wires A and B exchange locations between the left side and right side. Wires A and B are rotated inside of the magnetic tube of inductor 400, as shown by cross sectional views 401 through 405. Each cross section 401-405 corresponds to the location of its respective dotted line.

Inductor 400 corresponds to a structure such as described for inductor 301 in FIG. 3. In other embodiments, other structures may be used. As illustrated in cross sections 401-405, as the wires run from the location of cross section 401 on the left to the location of cross section 405 on the right, wire A is passed under wire B until the two wires rotate 180 degrees to the opposite sides of inductor 400. Wires A and B are kept conductively isolated while maintaining an inductive coupling through the length of the magnetic tube. In some embodiments, the wires may be rotated as shown to allow for simpler routing of signals that inductor 400 is coupled to in a circuit.

It is noted that FIG. 4 is merely an example. In other embodiments, the structure of inductor 400 may differ from the structure illustrated. Dimensions may differ as well the direction of the rotation. Although a rotation of 180 degrees is shown, in various embodiments, any suitable degree of rotation may be implemented as is suitable to the application.

Figure 5:
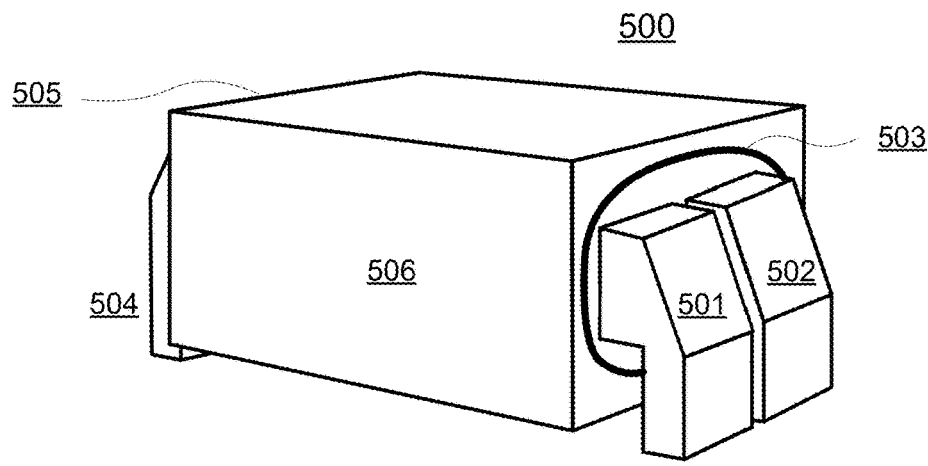
FIG. 5 illustrates an embodiment of an inductor, showing terminals for mounting.

Moving now to FIG. 5, an embodiment of a packaged inductor, including terminals for mounting, is shown. Inductor 500 includes terminals 501, 502, 504, and 505 (not visible), as well as magnetic tube 503. These components are coupled with package body 506. Inductor 500 may correspond to any suitable two-wire inductor structure, such as, for example, any of inductors 200, 210, 301, 302, 303, 304, 307, or 400 from FIGS. 2, 3, and 4.

In the present embodiment, on one end of inductor 500, terminal 501 is coupled to a first wire and terminal 502 is coupled to a second wire, both wires not visible and running through magnetic tube 503. At the other end of inductor 500, terminal 504 is visible and is coupled to either the first or second wire, depending if the wires are rotated within magnetic tube 503 as described above in regards to FIG. 4. Terminal 505, also at the other end, but not visible, is coupled to the wire not coupled to terminal 504. Package body 505 encapsulates magnetic tube 503 and the two wires therein. As illustrated, the ends of magnetic tube 503 are not covered by package body 505. In other embodiments, however, package body 505 may extend further past the ends of magnetic tube 503, such that only terminals 501, 502, 504, and 505 extend outside of the package body.

It is noted that FIG. 5 is merely an example for demonstrating an embodiment of a packaged inductor. In other embodiments, dimensions of the wires may vary. Although an inductor with two wires is illustrated, a similar packaging structure may be used for other wire counts.

Figure 6:
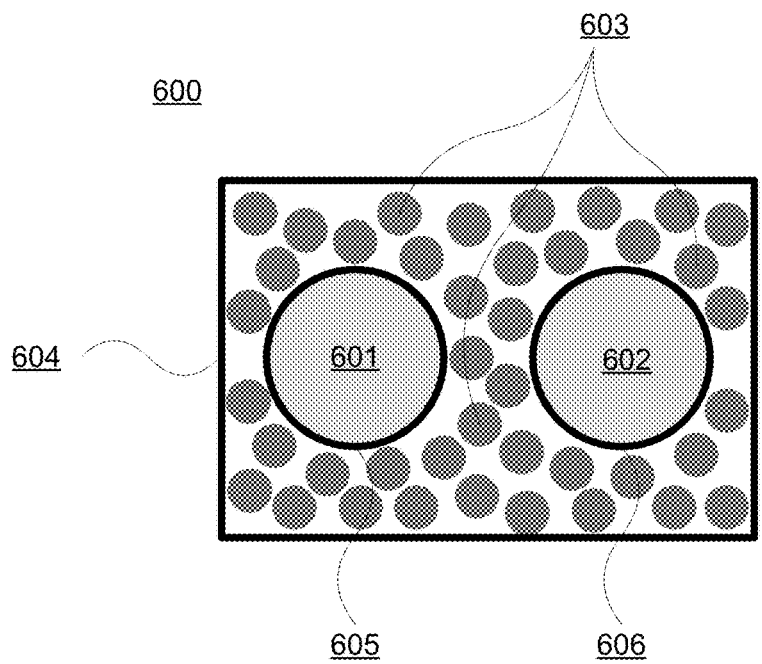
FIG. 6 shows another embodiment of an inductor.

Turning to FIG. 6, another embodiment of an inductor is illustrated. FIG. 6 shows a cross section of inductor 600, including wires 601 and 602, a plurality of magnetic beads 603, an encapsulating package 604, and wire shielding 605 and 606.

In the present embodiment, inductor 600 uses the plurality of magnetic beads 603 in place of a magnetic tube. The inductance of wires 601 and 602 may be controlled by a density of the number of magnetic beads 603 as well as a density of each individual magnetic bead 603. Encapsulating package 604 is formed around magnetic beads 603 to form structural rigidity and hold magnetic beads 603 in place. The size of encapsulating package 604 can determine the density of the number of magnetic beads 603. Wire shielding 605 and 606 prevent magnetic beads 603 from creating a conductive path between wires 601 and 602.

It is noted that FIG. 6 is merely an example. Although two wires are shown in FIG. 6, in various embodiments, inductor 600 may include a single wire or any number of additional wires. In other embodiments, encapsulating package 604, rather than being rectangular as illustrated, may be any suitable shape.

Figure 7:
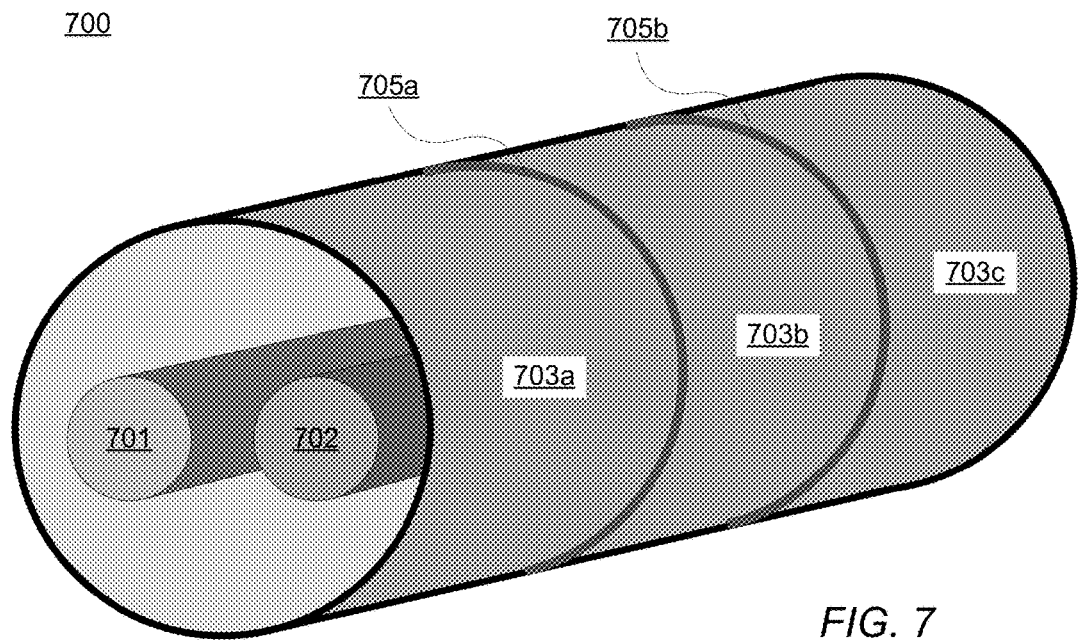
FIG. 7 depicts an embodiment of an inductor with a segmented magnetic layer.

Moving to FIG. 7, an embodiment of an inductor with a segmented magnetic layer is illustrated. Inductor 700 includes wires 701 and 702, and magnetic tube 703 segmented into three segments, 703a, 703b, and 703c. Inductor 700 also includes dielectric layers 705a and 705b.

In the illustrated embodiment, segmenting magnetic tube 703 into segments 703a-c may reduce occurrences of eddy currents that can occur in response to changes in current through wires 701 or 702. For example, referring back to inductor 200 in FIG. 2, changes in current through wire 201 or 202 may induce eddy currents in magnetic tube 203. A longer magnetic tube 203 may generate higher currents which may, in turn, generate heat and/or electric fields. A segmented magnetic tube 703a-c that is a same overall length as magnetic tube 203 may reduce eddy currents in comparison. While each segment 703a-c may still generate eddy currents in response to changes in current through wires 701 or 702, the total current generated by all three segments 703a-c may be less than the current generated in magnetic tube 203, and therefore generated heat and electric fields will be reduced.

Dielectric layers 705a-b are used in the present embodiment to isolate each segment 703a-c to prevent eddy currents from passing between segments 703a-c. If current is allowed to pass between segments, then any benefit from segmenting magnetic tube 703 may be reduced or lost entirely. Dielectric layers 705a-b may be any suitable length to prevent current conduction from adjacent segments of magnetic tube 703 and layer 705a may be a different length from layer 705b.

It is noted that FIG. 7 is an example for demonstrating disclosed concepts. In other embodiments, the number of segments in magnetic tube 703 or the number of wires included in inductor 700 may vary from the illustrated embodiment. Relative shapes and sizes of components may also differ for various embodiments.

Figure 8:
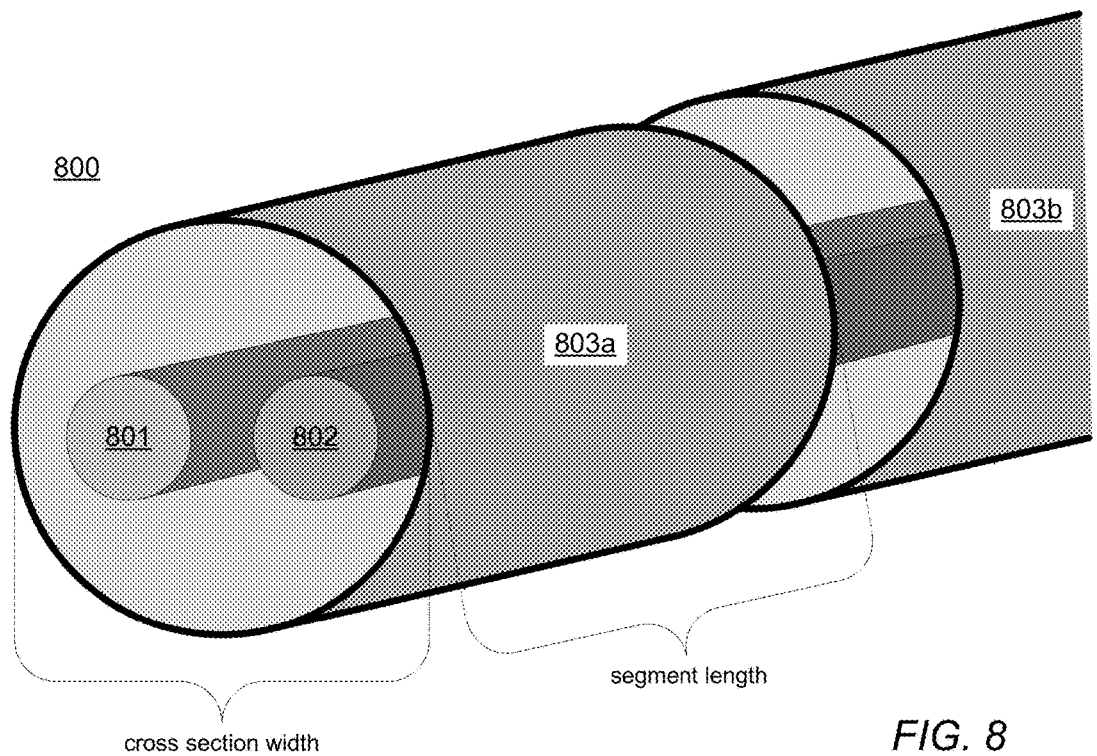
FIG. 8 illustrates another embodiment of an inductor with a segmented magnetic layer.

Turning now to FIG. 8, another embodiment of an inductor with a segmented magnetic layer is shown. Inductor 800 includes wires 801 and 802, as well as magnetic tube 803, divided into segments 803a and 803b. Similar to inductor 700 of FIG. 7, the segmented magnetic tube 803 may reduce effects of eddy currents in inductor 800.

In the illustrated embodiment, magnetic tube segments 803a and 803b are separated by an air gap rather than by a dielectric material. Use of a gap, in various embodiments, may reduce manufacturing costs and complexity compared to using another dielectric material to isolate the segments. In addition, exposing wires 801 and 802 in each gap may allow for inclusion of respective terminals for each of wires 801 and 802, thereby allowing inductor 800 to be divided into two smaller inductors.

The length of segment 803a, in combination with the cross section width contributes to both the inductance of the segment of inductor 800 as well as the susceptibility to eddy currents. The segment length, therefore, may be chosen to produce desired characteristics.

It is noted that FIG. 8 is merely an example. Relative shapes and sizes of components may also differ for various embodiments, including, for example, the various geometries shown in FIG. 3. In other embodiments, the number of wires included in inductor 800 or the number of segments in magnetic tube 803 may vary.

Figure 9:
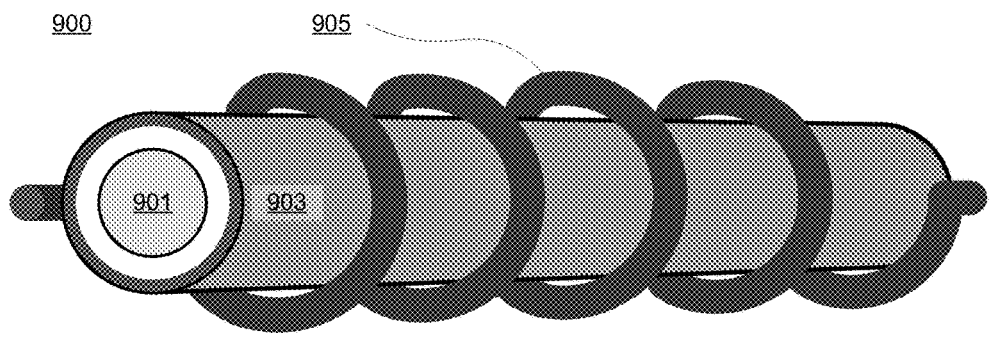
FIG. 9 illustrates an embodiment of an inductor wrapped by a solenoid wire.

Moving now to FIG. 9, an embodiment of an inductor wrapped by a solenoid wire is illustrated. Inductive device 900 includes wire 901, magnetic tube 903, and coiled wire 905. In the present embodiment, inductive device 900 allows for two inductors to be created from one structure. A first inductor is created from wire 901 and magnetic tube 903 as described above in regards to inductor 100 in FIG. 1.

A second inductor is created by wrapping coiled wire 905 around magnetic tube 903. The two inductors, therefore, share magnetic tube 903 as a magnetic component, with the first inductor utilizing the magnetic field on the interior of magnetic tube 903. The second inductor utilizes the magnetic field on the outside of magnetic tube 903 which may remain unutilized in inductor 100. An amount of inductance of the second inductor is determined, in part, by the number of windings of coiled wire 905 around magnetic tube 903.

The first and second inductors may be used individually on different signals. In other embodiments, the two inductors may be combined. For example, wire 901 and coiled wire 905 may be coupled at each end to form two inductors in parallel, thereby reducing a total amount of combined inductance when each end of the coupled wires are attached to separate nodes of a circuit. Additionally, wire 901 and coiled wire 905 may be coupled at one end and the uncoupled ends attached to separate nodes of a circuit, forming two inductors in series, and increasing a total combined inductance.

It is noted that FIG. 9 is merely an example of an inductor structure. Elements of the inductive device 900 may be combined with other concepts disclosed herein. For example, magnetic tube 903 may be segmented as shown in FIG. 7. In other embodiments, the number of wires included in inductive device 900 may vary.

Figure 10:
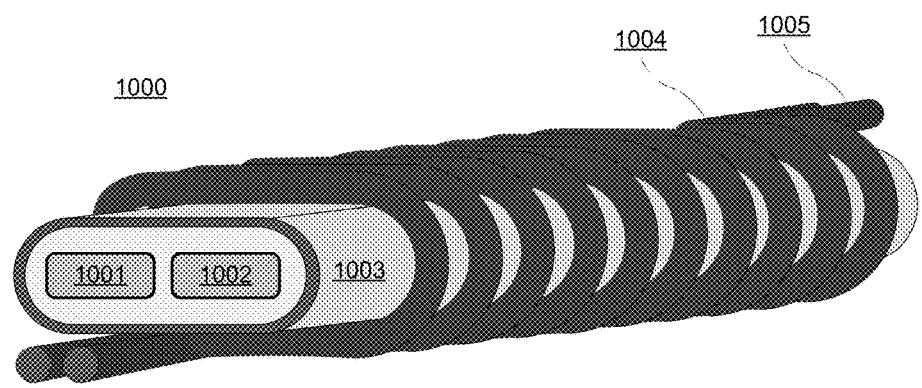
FIG. 10 shows an embodiment of an inductor wrapped by two solenoid wires.

Turning to FIG. 10, an embodiment of another inductor wrapped by a solenoid wire is illustrated. Inductive device 1000 includes wires 1001 and 1002, magnetic tube 1003, and coiled wires 1004 and 1005. Similar to inductive device 900 of FIG. 9, inductive device 1000 also allows for two inductors to be created from one structure. A first inductor is created from wires 1001 and 1002, and from magnetic tube 1003, similar to inductor 309 in FIG. 3. Although a structure similar to inductor 309 is illustrated, any suitable structure, including, but not limited to, inductors 301-307 in FIG. 3 may be used.

A second inductor is created by wrapping coiled wires 1004 and 1005 around magnetic core 1003, similar as described above in regards to FIG. 9. Two coiled wires, however, are wrapped instead of a single wire. By using two wires rather than one, an amount of inductance in wire 1004 may be adjusted by driving a control signal on wire 1005, and vice versa.

As described for inductive device 900, the two inductors of inductive device 1000 may be used as individual inductors, with the first inductor again utilizing the magnetic field within magnetic tube 1003 and the second inductor again utilizing the magnetic field on the outside of magnetic tube 1003. In addition, the two inductors may be combined as previously described. For example, wire 1001 may be coupled at each end with coiled wire 1004, forming two inductors in parallel. By driving wire 1002 and coiled wire 1005 with individual control signals, an amount of combined inductance may be controlled by two inputs, potentially allowing greater control. Moreover, wire 1001 may be coupled at a single end to coiled wire 1004 to create two inductors in series rather than parallel. Again, coupling wire 1002 and coiled wire 1005 to individual control signals may allow greater control of the total combined inductance of the series inductors.

It is noted that inductive device 1000 of FIG. 10 is an example for demonstrative purposes. Although two wires are shown within magnetic tube 1003, any suitable number of wires may be used. Likewise, any suitable number of coiled wires may be wrapped around magnetic tube 1003 in place of the two illustrated wires.

Figure 11:
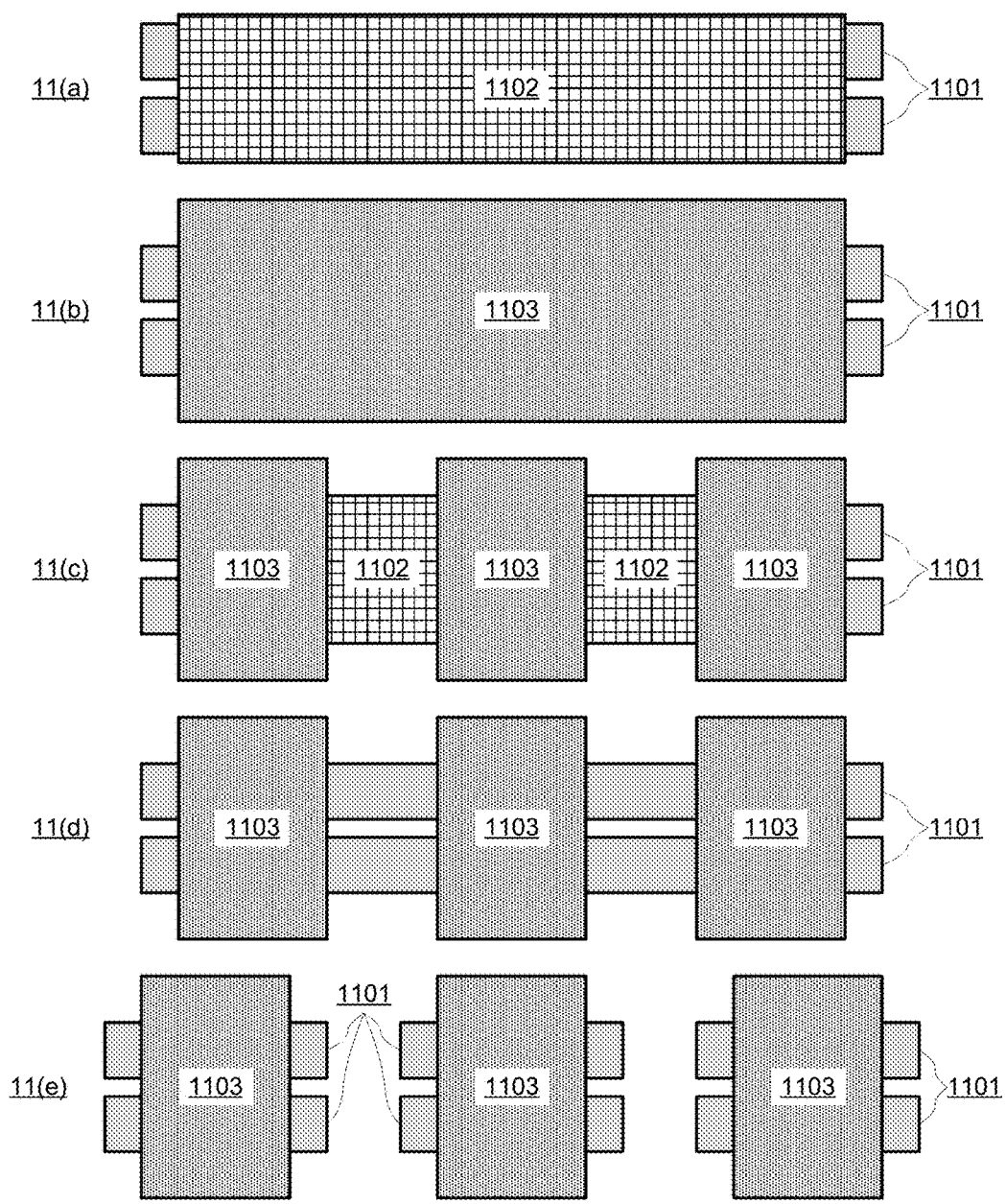
FIG. 11 depicts five illustrated phases [11(a) to 11(e)] in the manufacture of an embodiment of an inductor.

Moving to FIG. 11, five phases, labeled 11(a) to 11(e), in the manufacture of an embodiment of an inductor are shown. The illustrated phases show the manufacture of three inductive devices, although the phases may apply to any suitable number of devices. Within the five phases, two wires 1101, magnetic tube 1102, and coating 1103 are included.

In phase 11(a), wires 1101 are inserted into a length of magnetic tube 1102. An excess length of wires 1101 extend beyond each end of magnetic tube 1102. In other embodiments, magnetic tube 1102 may be formed around wire 1101 using a deposition process to layer a magnetic material around wires 1101. Multiple layers, in some embodiments, may be deposited, alternating between magnetic and dielectric layers to form magnetic tube 1102. In step 11(b), a non-conductive and non-magnetic coating 1103 is applied. Coating 1103 covers the outside surface of magnetic tube 1102 and may, in some embodiments, also be applied in such a manner as to coat the inside of magnetic tube 1102 and wires 1101, thereby forming an isolating layer between them.

A masking phase 11(c) is used to strip portions of coating 1103, revealing magnetic tube 1102 in intervals, as shown. Another masking phase 11(d) strips the exposed portions of magnetic tube 1102, revealing wires 1101. In phase 11(e), wires 1101 are cut in the exposed areas, creating three inductive devices. In this wire cutting phase, the exposed portions of wires 1101 may also be bent to form terminals similar to terminals 501, 502, 504, and 505 illustrated in FIG. 5.

It is noted that the illustrated phases in FIG. 11 are an example for manufacturing an embodiment of an inductor. The phases have been simplified for clarity. In other embodiments, more or fewer phases may be included.

Figure 12:
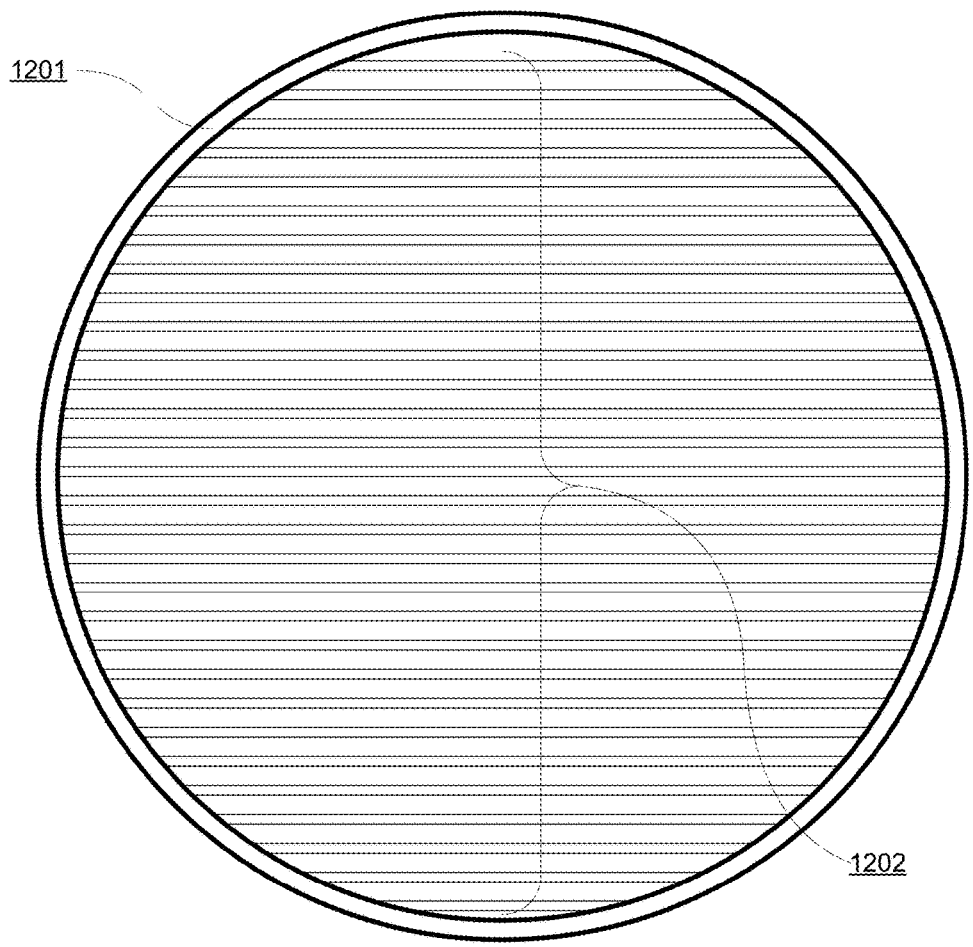
FIG. 12 depicts a wire frame with multiple pairs of wires attached for use in an embodiment of a manufacturing process for inductors.

Turning now to FIG. 12, a wire frame with multiple pairs of wires attached for use in an embodiment of a manufacturing process for inductors is illustrated. FIG. 12 includes wire frame 1201 and multiple pairs of wires 1202 strung in parallel across wire frame 1201. FIG. 12 illustrates an embodiment for manufacturing inductors, such as the various forms of inductors shown in FIG. 3.

In the present embodiment, to create inductors such as those previously described, wire pairs 1202 are placed or stretched taunt across wire frame 1201. Wire pairs 1202 are arranged in parallel, a predetermined distance apart. If the wires of wire pairs 1202 are insulated, then each pair of wires 1202 may be allowed to come into contact. Otherwise, enough distance must be kept to prevent conduction of current from one wire to the next. In some embodiments, an insulating material may be applied to each pair of wires 1202 using a spray or deposition process. Wire frame 1201 is mounted to a device allowing rotation of wire frame 1201 as necessary for applying the insulating material to each pair of wires, creating a desired shape and thickness. A magnetic tube or shell may be formed next, using a deposition process to apply one or more layers of magnetic material over the insulating material. Again, rotation of wire frame 1201 allows the deposition process to apply the layers in a desired form factor, such as, for example, any of the forms illustrated in FIG. 3. In some embodiments, each of wire pairs 1202 may be inside a magnetic tube prior to being mounted to wire frame 1201, in which case application of insulating material or magnetic material is skipped.

After the magnetic shell has been formed, wire pairs 1202 may be formed into inductors using the process presented in FIG. 11. Wire pairs 1202 may correspond to phase 11(a). Remaining on wire frame 1201, wire pairs 1202 may continue to phases 11(b) through 11(d). In some embodiments, wire pairs 1202 may be removed from wire frame 1201 and placed into a carrier before phase 11(e), which includes separating the inductors into individual devices.

In other embodiments, phase 11(e) may include positioning wire frame 1201 over a semiconductor wafer which has been processed to include multiple IC dies. Each pair of wires 1202 may be spaced from one another such that one or more rows align with a row of IC dies. Spacing of individual inductors along each wire pair 1202 may be formed with spacing such that one or more inductors align with each IC die. The process of cutting the pairs of wires 1202 between each formed inductor may include an operation attaching each inductor to one of the IC die.

It is noted that FIG. 12 is merely an example. Although wires are shown as being arranged in pairs, in various other embodiments, any suitable number of wires may be grouped together to form inductors including any desired number of wires, including a single wire. Wire frame 1201 is shown as round, but may any suitable shape in other embodiments.

Figure 13:
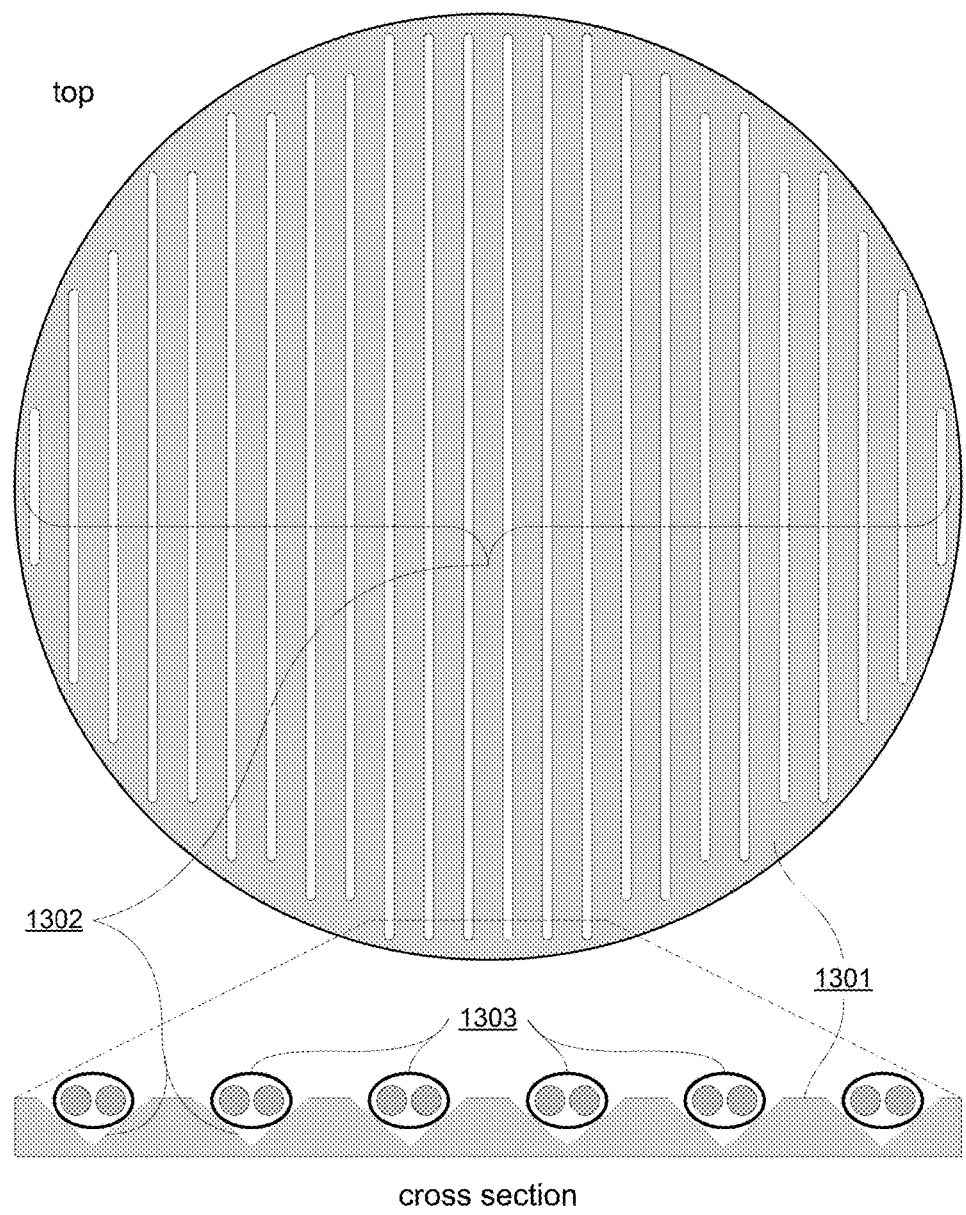
FIG. 13 illustrates a wafer shaped carrier for use in manufacturing inductors.

Moving now to FIG. 13, a wafer shaped carrier for use in manufacturing inductors is shown. Carrier 1301 is shown in a top view as well as a cross section view. Carrier 1301 includes grooves 1302 for holding rows of inductors 1303 during manufacturing phases, such as illustrated in FIG. 11.

In the present embodiment, carrier 1301 holds strands of inductors 1303 that remain connected, such as illustrated in phase 11(d). Wire frame 1201 presented in FIG. 12 may be used to process inductors 1303 through phase 11(d). At phase 11(d), the strands of inductors 1303 may be separated from wire frame 1201 and each strand placed in a corresponding groove 1302, as shown in the cross section view. Once placed in grooves 1302, the strands of inductors 1303 may be separated into individual inductive devices, each one including one or more inductors 1303. Separation of the inductive devices may include using lasers, chemicals, saws, or any other suitable process for cutting the exposed wires between the individual inductive devices.

In some embodiments, an adhesive may be used to hold each strand of inductors 1303 in the corresponding groove 1302. Other embodiments may rely on gravity and friction to keep each strand of inductors 1303 within its corresponding groove 1302. Carrier 1301 may be comprised of silicon, glass, plastic, or any suitable metal or metal alloy.

It is noted that carrier 1301 of FIG. 13 is merely one embodiment demonstrating the disclosed concepts. In other embodiments, carrier 1301 may be any suitable shape in addition to the round shape illustrated. Other embodiments of carrier 1301 may include tabs or other fixtures to be grasped by processing equipment. Grooves 1302 are shown to be 'V' shaped, although, in other embodiments, grooves 1302 may be created in any appropriate shape.

Figure 14:
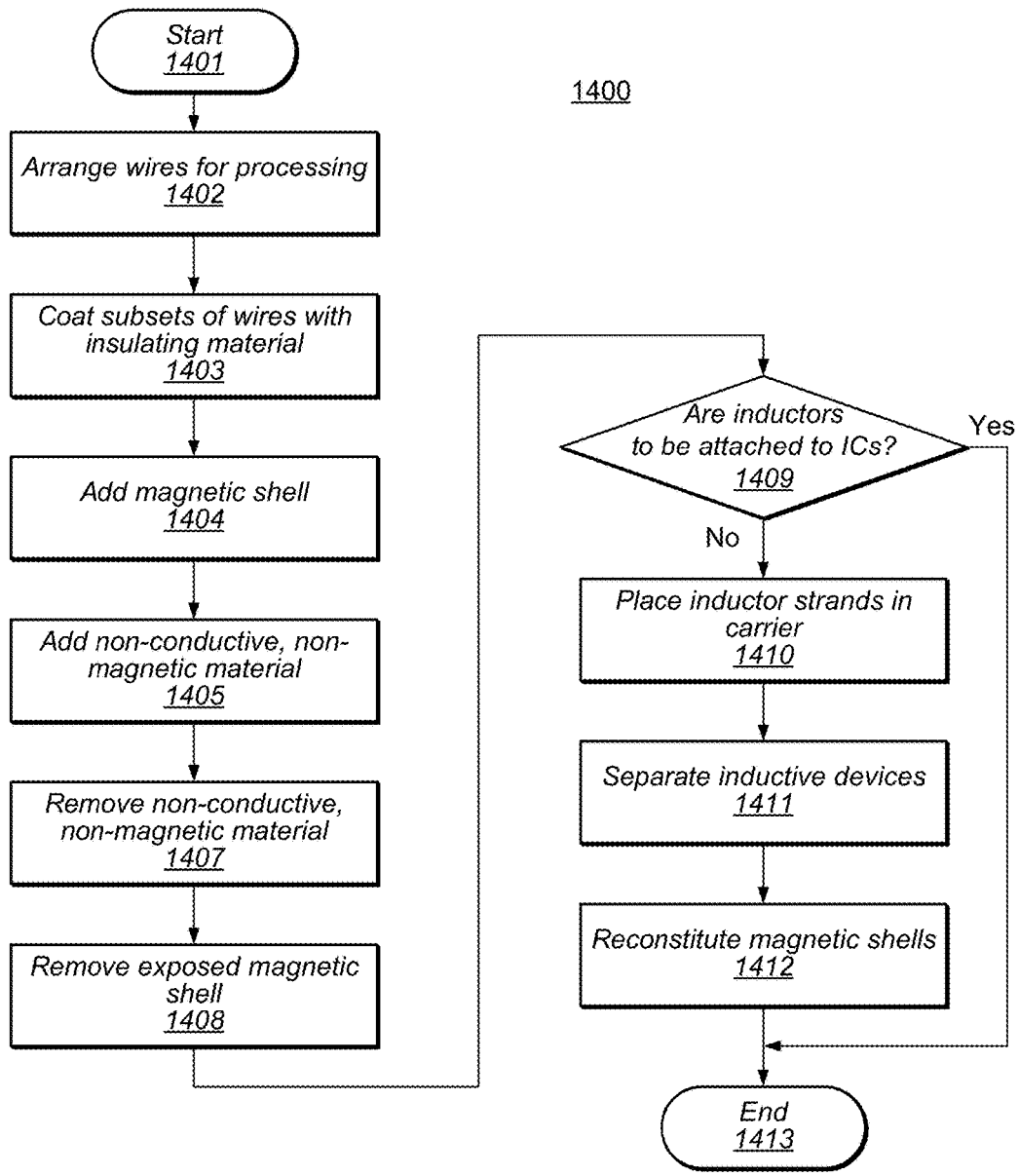
FIG. 14 shows a flow diagram for a method for manufacturing inductors.

Turning to FIG. 14, a flow diagram for a method for manufacturing inductors is illustrated. Method 1400 may be applied to the manufacturing phases shown in FIG. 11 for use in creating any suitable inductor, such as, for example, any of inductors 301 through 309 in FIG. 3. Referring collectively to the phases in FIG. 11 and the method in FIG. 14, method 1400 may begin in block 1401.

A plurality of wires is arranged for the manufacturing process (block 1402). In the present embodiment, the wires are arranged on a wire frame, such as wire frame 1201 shown in FIG. 12. In other embodiments, wires may be arranged in carriers, such as, e.g., carrier 1301 in FIG. 13, or other suitable devices. In some embodiments, the wires may each be insulated to avoid conducting current to adjacent wires or other conductive material. In other embodiments, the wires may be bare and require physical separation from other conductive materials. The wires are arranged into subsets corresponding to a number of wires to be included in each inductor. Subsets may include a single wire to any suitable number of wires.

Each subset of wires is coated in an insulating material (block 1403). The insulating material, such as, for example, a glass or plastic compound, may be sprayed or deposited onto each subset of wires. The insulating material may also be applied in such a manner as to create a desired cross sectional shape, such as, for example, any of the cross sectional shapes illustrated in FIG. 3. In some embodiments, the applied insulating material may be shaped after application to the subsets of wires, such as, for example, by a molding or casting process. In various embodiments, the insulating material may be pliable to allow manipulation of the shape in further operations, or may be rigid to preserve the current shape. In embodiments using insulated wires, operations of block 1403 may be optional.

A magnetic shell is added to each subset of wires (block 1404). In the present embodiment, the magnetic shell is deposited in multiple layers onto the insulating material until a predetermined thickness and shape are achieved, thereby imparting a desired magnetic field onto the subset of wires. In some embodiments, a magnetic annealing process may be performed after deposition to create desired magnetic properties in the magnetic shell, such as aligning the magnetic poles into a desired orientation. In other embodiments, each subset of wires may be inserted into a pre-existing magnetic shell with the desired properties rather than forming the shell around the wires.

A non-conductive and non-magnetic material is added around each magnetic shell (block 1405). In some embodiments, the non-conductive and non-magnetic material may correspond to a body of a package for the inductors. In such embodiments, the package body may be a rigid plastic to provide protection and strength to the final inductor. In other embodiments, such as, for example, if the inductors will be included in a larger package with other components, the non-conductive and non-magnetic material may be pliable to allow further manipulation of the shape.

At this point, the structure of each of the subsets of wires may correspond to phase 11(*b*) of FIG. 11. The structure may be used as an inductor, as is, by attaching each end of each wire of the subset to appropriate nodes of a circuit. In the current embodiment, however, the structure corresponds to a strand of inductors and continues processing to create multiple smaller inductors.

The non-conductive and non-magnetic material is removed between each inductor in the strand (block 1407). Each strand of inductors is masked to protect the body of each individual inductor. A material is applied to each strand in a pattern representing the body size of each inductor in the strand. The material is selected to be resistant to a chosen process for removing the non-conductive and non-magnetic material. The material may be removed by using any suitable method, such as, e.g., a chemical etching method, a mechanical filing method, or thermal method. The strand of inductors may now correspond to phase 11(*c*) of FIG. 11.

The magnetic shell is removed between each inductor in the strand (block 1408). Areas of the magnetic shell exposed by the removal of the non-conductive and non-magnetic material in block 1407 are removed. In various embodiments, insulating material inside the magnetic shell and surrounding the subset of wires may be removed in the same step or an additional step. The masking used in block 1407 may be reused when removing the exposed magnetic shell, or, in other embodiments, new masking material may be applied. Removal of the magnetic shell, in various embodiments, is accomplished by using a chemical etching, a mechanical filing, or thermal method. Each wire of the subset of wires in the strand is exposed. In the current state, the strand of inductors may correspond to phase 11(*d*) of FIG. 11.

Further operations of the method may depend on a planned usage of the inductors (block 1409). If the inductors in each strand will be attached to IC dies, then the method ends in block 1413. Further details regarding attaching the inductors to IC dies will be provided below. If, however, the inductors will be formed into individual devices to be coupled to various circuits at a later time, then the method moves to block 1410 to continue the manufacturing process.

Each strand of inductors is placed onto a carrier (block 1410). Each strand is separated from the wire frame and placed onto a carrier, such as, for example, carrier 1301 in FIG. 13. An adhesive may be used, in some embodiments, to hold the inductors in place within grooves of the carrier during subsequent processing operations. In other embodiments, the wire frame and carrier may be designed such that the wire frame secures to the carrier with the strands of inductors aligned with the grooves of the carrier.

Each strand of inductors is separated into individual inductors (block 1411). The separation process may use a laser, a saw, or chemicals to cut the exposed wires between each of the inductors in given strand. In some embodiments, a subset of the exposed wires may be cut, leaving smaller strands of two or more inductors to be used as a single inductive device.

The individual inductors, or strands of two or more inductors, are reconstituted (block 1412). As used herein, "reconstituting" an inductor refers to a process of forming a desired shape of the device, including terminals for coupling the inductors to circuits. Inductors may be pressed or molded into a desired shape, such as any shapes illustrated in FIG. 2 or 3. The reconstitution process may also include adding a mold compound (e.g., a plastic material) around the magnetic shell to form a protective body. Ends of the wires of each inductor may be cut and/or bent into a suitable shape. The method ends in block 1413.

It is noted that the method illustrated in FIG. 14 is merely an example embodiment. Variations on this method are possible. Some operations may be performed in a different sequence, and/or additional operations may be included.

Figure 15:
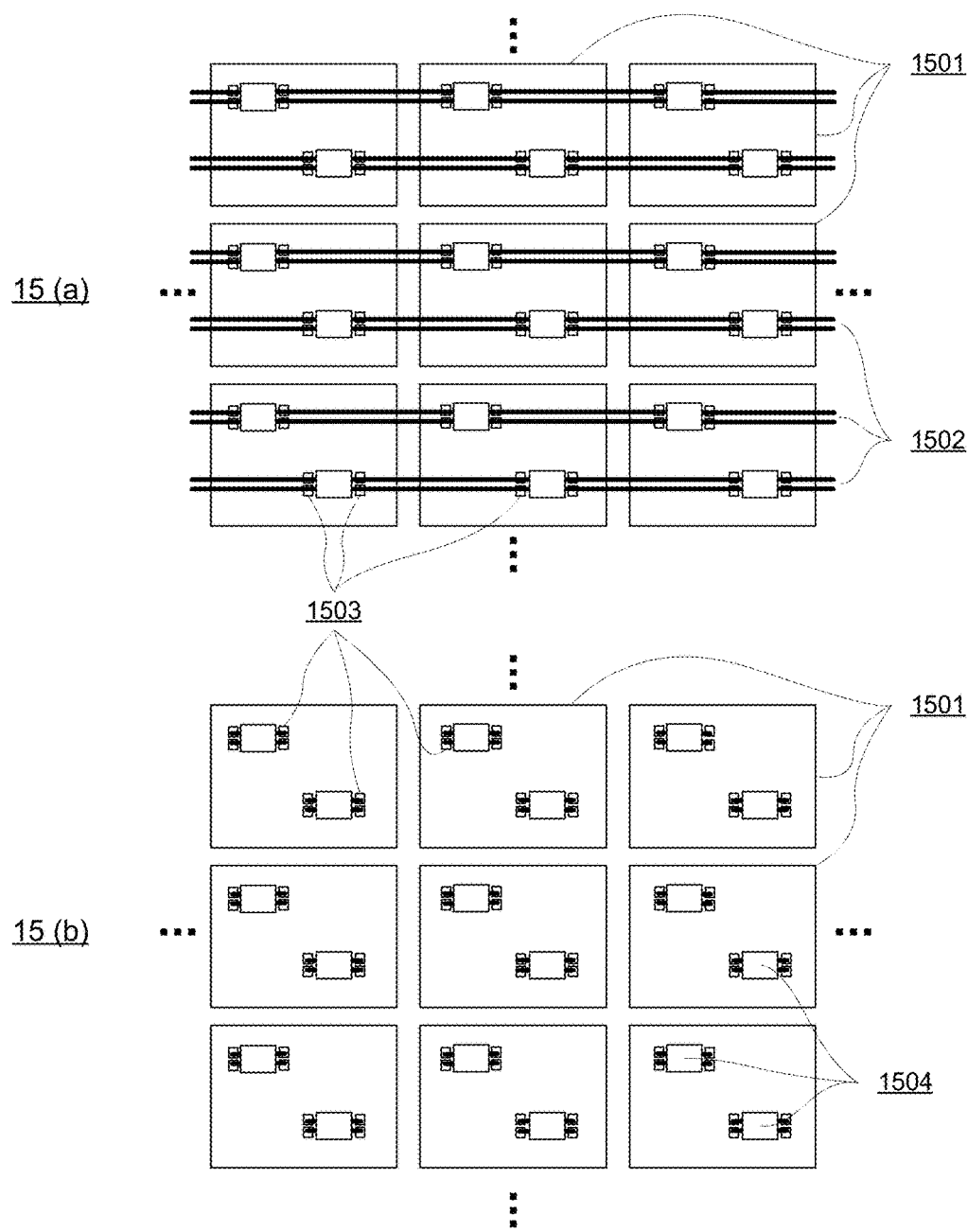
FIG. 15 includes two illustrated phases [15(a) and 15(b)] for attaching an embodiment of an inductor to an IC die.

Moving to FIG. 15, two phases, labeled 15(*a*) and 15(*b*), for attaching an embodiment of an inductor to an IC die are shown. The illustrated phases show two respective inductors 1503 being attached to bond pads 1503 on each of nine IC dies 1501, beginning with two strands of inductors 1502 per row of dies 1501. The phases may apply to any suitable number of dies or number of inductors per die.

In phase 15 (*a*) of the illustrated embodiment, inductor strands 1502 are positioned over rows of dies 1501. The bodies of each inductor in strands 1502 are aligned between sets of bond pads 1503. In some embodiments, each wire strand 1502 may be attached to a wire frame such as wire frame 1201 in FIG. 12. Wire frame 1201 may be sized to correspond to a size of wafers on which IC dies 1501 are fabricated. In such an embodiment, to align the strands 1502 to IC dies 1501 on a wafer, wire frame 1201 is positioned concentric to the wafer with strands 1502 running parallel to the rows of IC dies 1501. In some embodiments, an adhesive may be used to hold each inductor body in place while each inductor is separated from strands 1502. Bond pads 1503 are metal pads created in a given layer of metal during manufacture of the IC die. Bond pads 1503 may be exposed through openings in a passivation layer covering the top of each die. In some embodiments, additional metal may be deposited on top of each bond pad 1503 to increase the height of a contact point above the top of the passivation.

In phase 15 (*b*), inductors 1504 are separated from strands 1502. Exposed wire between each inductor 1504 is removed using a suitable method, such as laser cutting, thermal cutting, mechanical sawing, or chemical etching, for example. In some embodiments, such as when laser or thermal cutting is used, the cutting step may also attach the ends of the wires of each inductor 1504 to a respective bond pad 1503. In other embodiments, additional operations may be included to bend the wires to contact each bond pad 1503 and to solder each wire to the respective bond pad 1503.

It is noted that the phases illustrated in FIG. 15 are merely examples. In other embodiments, any suitable number of inductors may be attached to each die. Although FIG. 15 shows only one inductor per strand being attached to a respective die, more than one inductor per strand may be attached to a given die.

Figure 16:
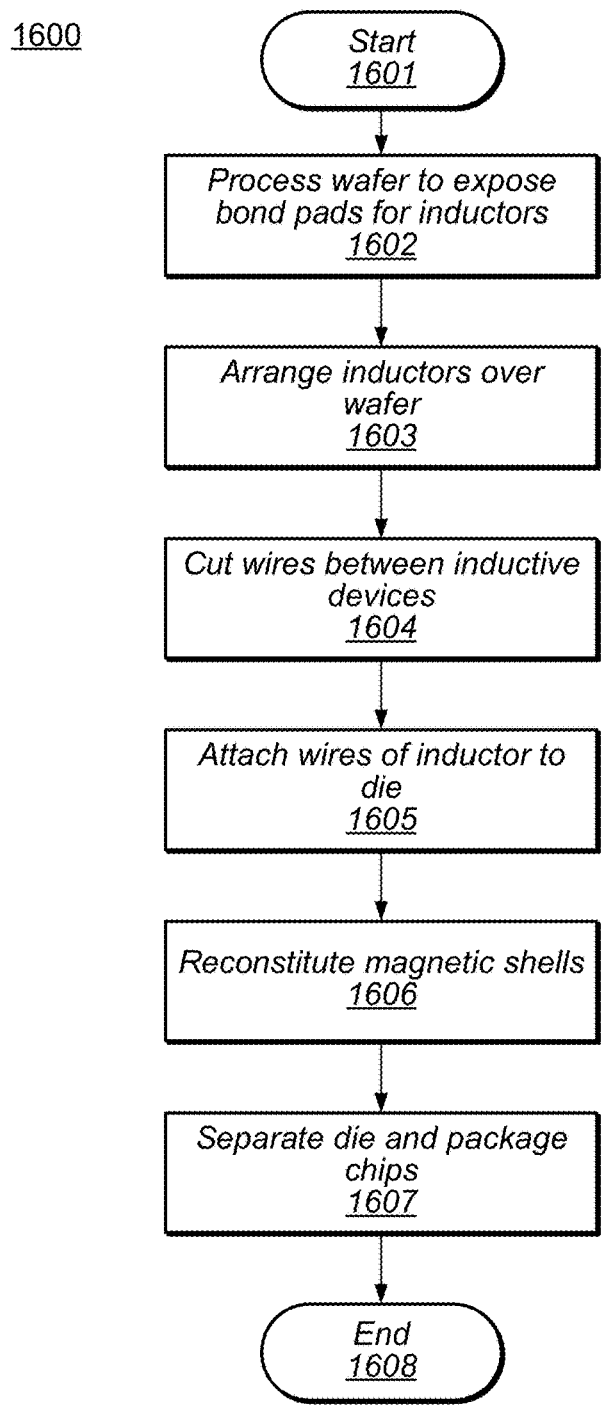
FIG. 16 illustrates a flow diagram for a method for attaching inductors to integrated circuit dies.

Turning now to FIG. 16, a flowchart for a method for attaching inductors to IC dies is illustrated. Method 1600 may be applied to the manufacturing phases shown in FIG. 15 for use in attaching an inductor, such as, for example, any of inductors 301 through 309 in FIG. 3, to an IC die. In some embodiments, method 1600 may be used in conjunction with method 1400 of FIG. 14. Referring collectively to the phases in FIG. 15 and the method in FIG. 16, method 1600 may begin in block 1601.

Wafers which include IC dies onto which inductors will be attached are processed to expose bond pads to be used to attach the inductors (block 1602). To couple inductors into circuits within a die, such as, for example, one of IC die 1501, bond pads 1503 are fabricated during the IC manufacturing process. Generally speaking, a passivation layer may be created on top of the circuits of each IC die 1501 to protect the circuits underneath. To reach bond pads 1503, holes are created in the passivation to expose bond pads 1503. In some embodiments, additional metal is deposited on bond pads 1503 to raise the contact point of the pads to a level higher than the passivation.

Stands of inductors are arranged over the IC dies on the wafer (block 1603). Method 1600 may, in some embodiments, be applied after method 1400 in FIG. 14. In such embodiments, operations of block 1603 occur after block 1409 in which a determination is made that the inductors in each strand will be attached to IC dies. At this stage, the strands of inductors may correspond to strands 1502 in FIG. 15. The strands 1502 are aligned over bond pads 1503 such that an exposed wire on either side of a body of a given inductor is above each bond pad 1503. In some embodiments, strands 1502 may remain attached to a wire frame, such as wire frame 1201 in FIG. 12, and the wire frame 1201 is aligned with the wafer to produce the desired alignment.

Wires between each inductor of each strand 1502 are cut (block 1604). Various methods may be used to cut the exposed wires, as previously disclosed. Excess wire is removed. In some embodiments, the cutting process may include a step to bend each wire such that it comes into contact with a respective bond pad 1503. The inductors may now correspond to inductors 1504.

The wires of each inductor are attached to respective bond pads (block 1605). Each wire from a given inductor 1504 is attached to a respective bond pad 1503, thereby coupling the given inductor 1504 to the circuits with the corresponding die 1501. The wires may be attached by soldering or fusing the wires to the bond pads 1503.

The magnetic shells of inductors 1504 are reconstituted to produce desired magnetic fields (block 1606). During the manufacturing process, the magnetic shells in inductors 1504 may experience conditions, such as, for example, high temperatures, that may degrade or alter the magnetic field of the shell. A reconstitution process is used to restore the magnetic field to include desired properties. In some embodiments, the magnetic shell may not have a significant magnet field until undergoing a reconstitution process. This reconstitution process involves applying a magnetic field to the shield until desired magnetic properties have been imparted into the shell. The reconstitution process may include elevating a temperature of inductors 1504 while the magnetic field is applied.

IC dies 1501 are separated and packaged as IC chips (block 1607). IC dies 1501, in the present embodiment, are still included on a corresponding wafer at this stage. Dies 1501 are separated using, for example, a wafer saw, to cut rows and columns between each die 1501 on the wafer until each die has been separated. Each die 1501 may be packaged in a desired package type. A plastic or other material may be used to encapsulate each die, including the coupled inductors 1504 into a single IC chip. In some embodiments, each inductor 1504 may be completely contained within the package, with no direct connections to any pins of the package. In place of a package, IC dies 1501 may be attached directly to circuit boards.

It is noted that method 1600 in FIG. 16 is an example process. Variations of this method are contemplated. In other embodiments, additional operations may be included. Various operations may be performed in a different sequence or in parallel.

Figure 17:
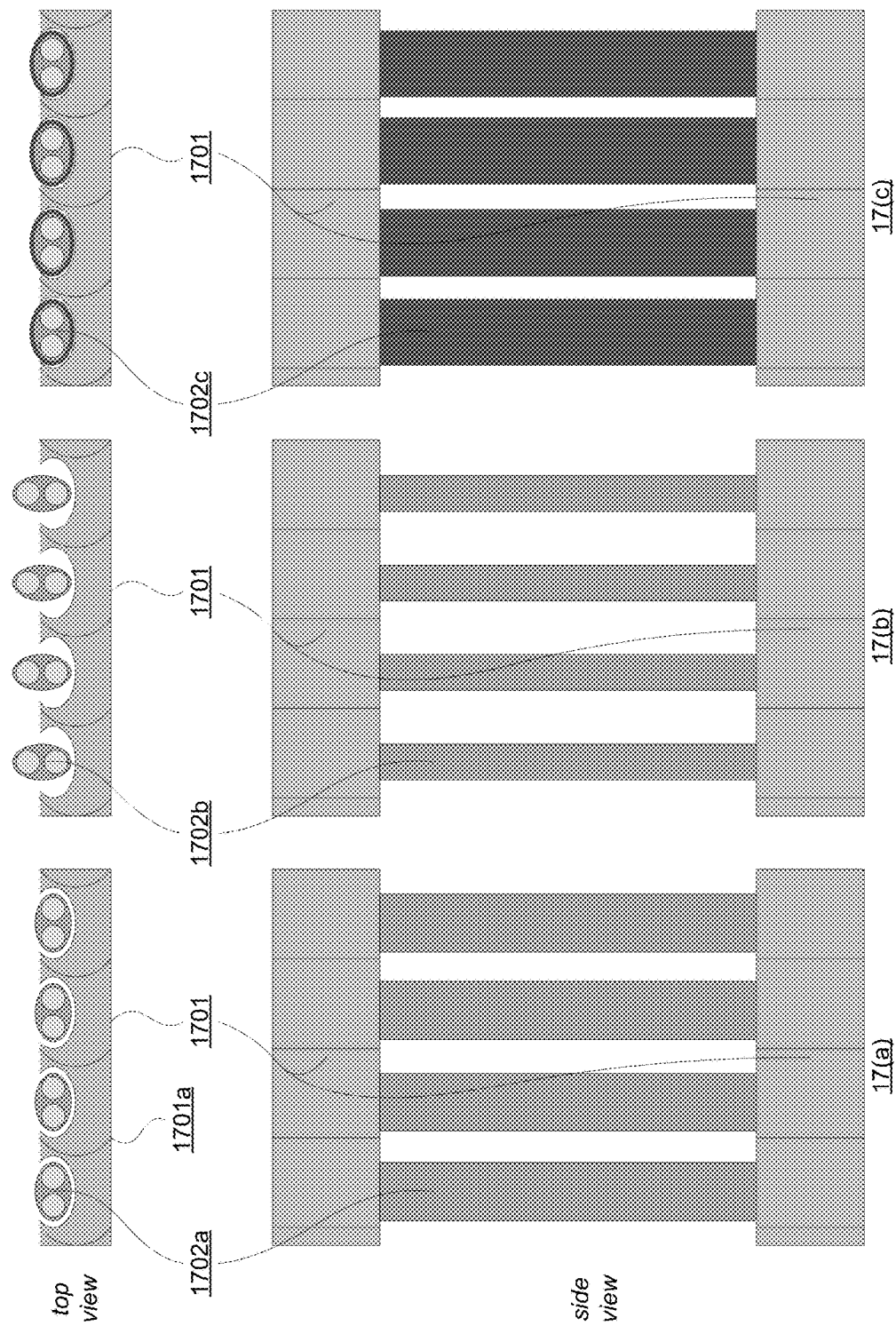
FIG. 17 depicts three illustrated phases [17(a) through 17(c)] for depositing a magnetic shell onto wires.

Moving now to FIG. 17, three phases of an embodiment, 17(a) through 17(c), are illustrated for depositing a magnetic shell onto wires. Each phase 17a-c includes wire carrier 1701. Insulated wires 1702a are shown in a first state in phase 17a. Insulated wires 1702a are then shown in a second state in phase 17b, and then in phase 17c, insulated wires 1702c are in a third state. Both top views and side views are illustrated for each phase 17a-c.

In phase 17a, a plurality of insulated wires 1702 are stretched between two sides of wire carrier 1701, as illustrated in the side view. In the present embodiment, insulated wires 1702a include two round wires with an oval insulating material, as shown in the top view. In other embodiments, however, any suitable number and form of wires and insulator shape may be used. Wire carrier 1701 is segmented as indicated by the curved lines such as 1701a. This segmentation allows flexibility of wire carrier 1701 that will be demonstrated in another figure below.

In the present embodiment, wire carrier 1701 allows for each pair of insulated wires 1702b to rotate as shown in phase 17b. This rotation allows access for 360 degrees around insulated wires 1702b, which will allow for a magnetic material to be deposited uniformly around each pair of insulated wires 1702b. Phase 17c illustrates insulated wires 1702c after the magnetic material has been deposited to form a magnetic shell.

It is noted that the phases of FIG. 17 are merely an example. While only four pairs of wires are illustrated, in other embodiments, any number of insulated wires may be included on a wire carrier. Although insulated wires are show, use of bare wires is also contemplated. In some embodiments, a hollow tube may be placed into wire carrier 1701, rather than wires. In such embodiments, a magnetic shell is formed around the hollow tube and one or more wires may be inserted into the hollow tube after the magnetic shells are formed.

Figure 18:
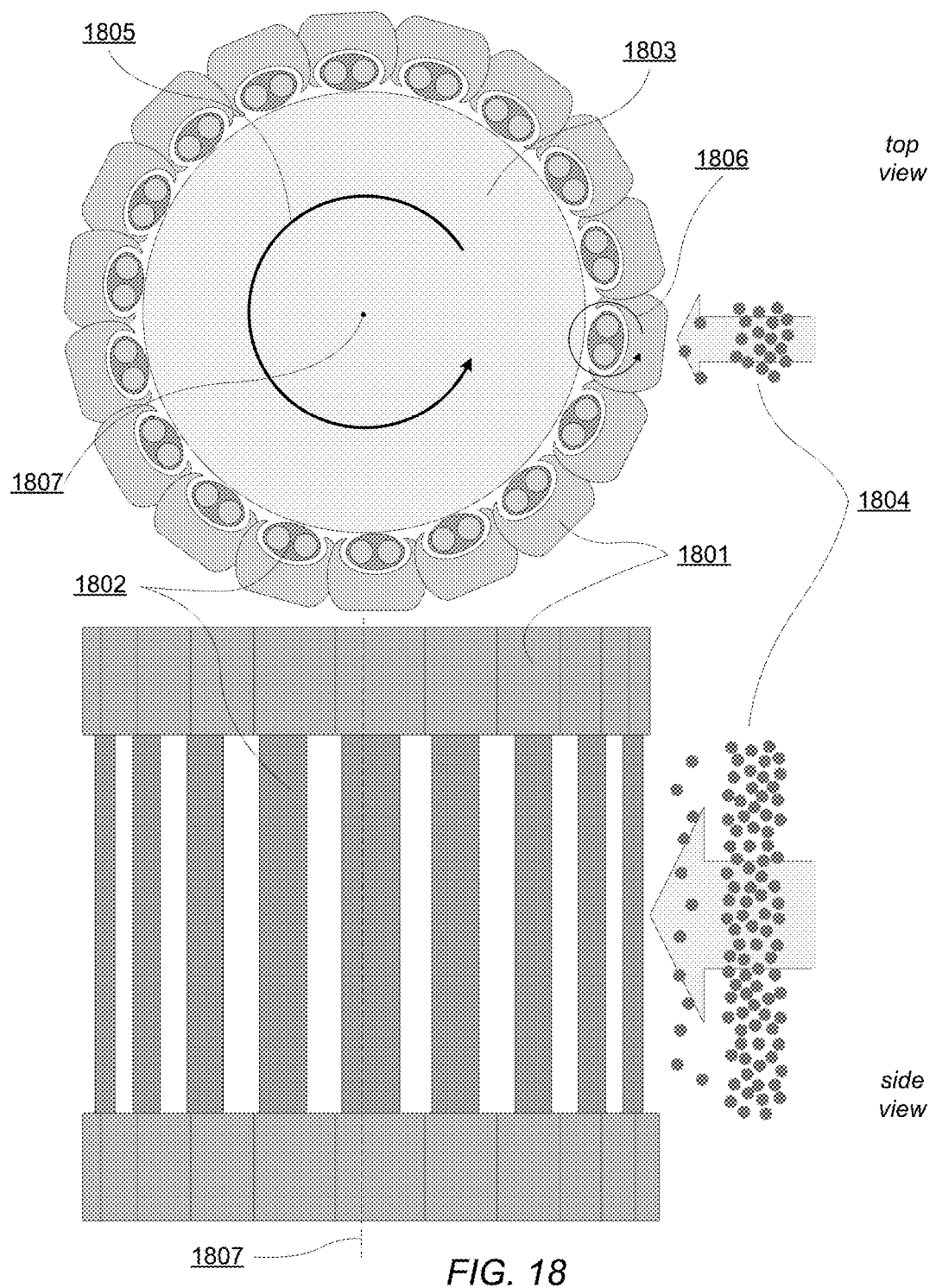
FIG. 18 illustrates an apparatus for depositing a magnetic shell onto wires.

Turning to FIG. 18, an apparatus for depositing a magnetic shell onto wires is illustrated. FIG. 18 includes a top view and a side view of a cylindrical apparatus for depositing magnetic and/or dielectric material onto insulated wires to create inductors. FIG. 18 includes wire carrier 1801 which may correspond to wire carrier 1701 in FIG. 17 and a plurality insulated wires 1802, which may correspond to insulated wires 1702a in FIG. 17. Wire carrier 1801 mounts to carousel 1803, wrapping around carousel 1803 as shown in the top view. Magnetic or dielectric material 1804 is deposited onto insulated wires 1802.

As previously described, wire carrier 1801 is segmented, with each pair of insulated wires 1802 stretched between two segments, one at each end. The segmentation allows wire carrier 1801 to wrap around carousel 1803. Wire carrier 1801 may be attached to carousel 1803 by any suitable method such as, for example, screws or clamps.

In the illustrated example, carousel 1803 rotates around its main axis 1807, as shown by arrow 1805. As carousel 1803 rotates, magnetic material 1804 is emitted from a source towards each pair of insulated wires 1802 as they rotate past the source. In addition to rotating around carousel 1803, each pair of insulated wires 1802 rotates as shown by arrow 1806. The rate of rotation of each pair of insulated wires 1802 may correspond to several rotations of carousel 1803. For example, for one 360 degree rotation of carousel 1803, each pair of insulated wires 1802 may rotate only 45, 60, or 90 degrees. The slower rotation of insulated wires 1802 may allow for a uniform thickness of magnetic material 1804 to be deposited around all 360 degrees of wires 1802. In other embodiments, multiple sources for magnetic material 1804 may be placed around carousel 1803, allowing for a higher rate of rotation.

The process may be repeated emitting a dielectric material 1804 rather than magnetic material. Further applications of material 1804 may alternate between magnetic and dielectric, forming a magnetic shell with multiple layers of magnetic material. Magnetic properties may be adjusted by altering a thickness of each layer and by applying different numbers of layers.

It is noted that the apparatus of FIG. 18 is one example for use in manufacturing inductors. Although each pair of insulated wires includes two wires, any suitable number of wires may be used. In addition the shape of each wire and of the insulation may vary in other embodiments.

Figure 19:
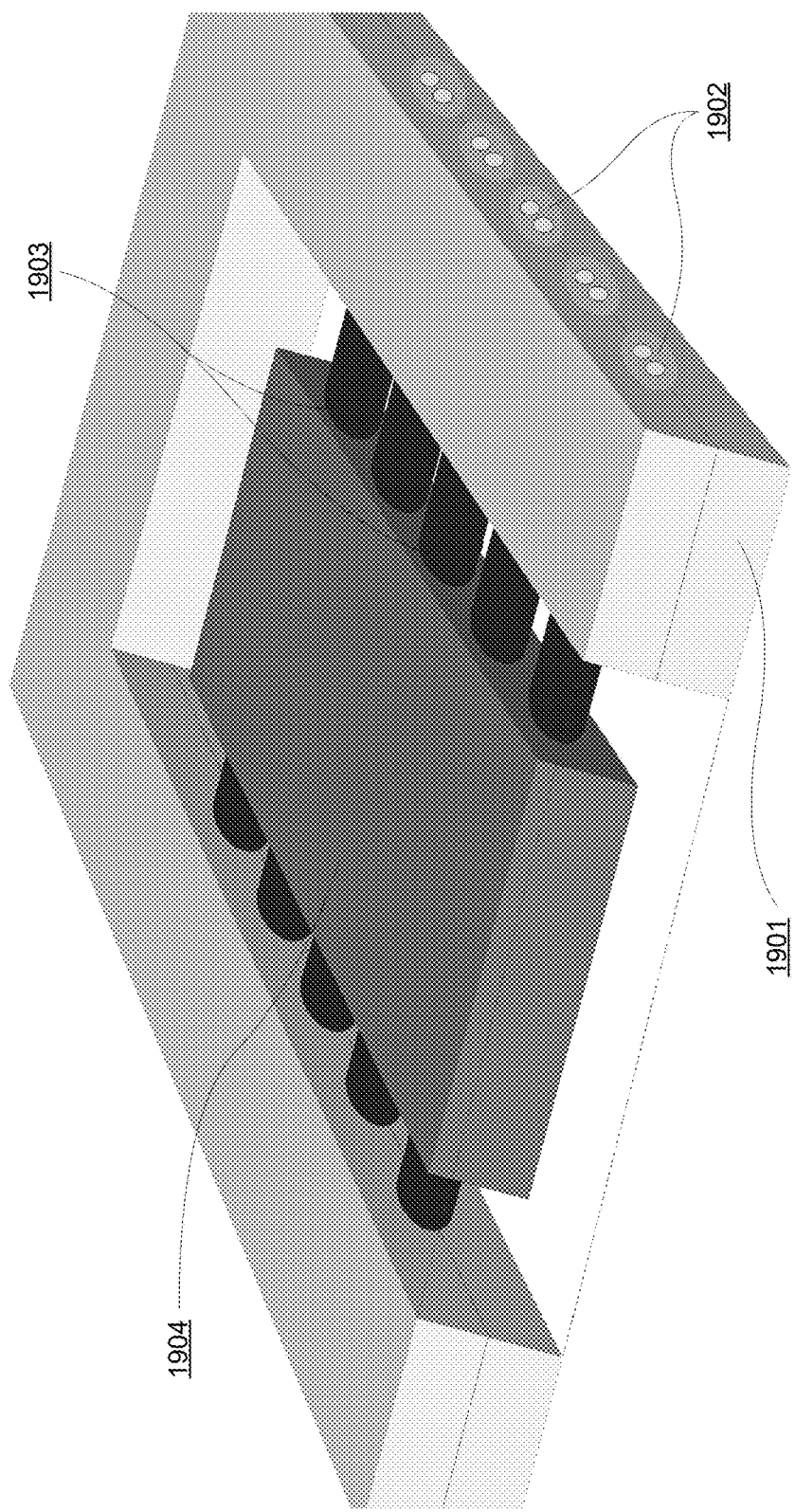
FIG. 19 shows an apparatus for applying a mold compound to form packaged inductors.

Moving to FIG. 19, an apparatus is shown for applying a mold compound to form packaged inductors. FIG. 19 includes wire carrier 1901, insulated wires 1902 attached to wire carrier 1901, inductive devices 1903 formed by an addition of magnetic shells to insulated wires 1902, and mold compound 1904. In some embodiments, wire carrier 1901 may correspond to wire carrier 1701 in FIG. 17. Operations illustrated in FIG. 19 and described herein may be performed subsequent to operations shown in FIGS. 17 and 18.

In FIGS. 17 and 18, insulated wires attached to a wire carrier are coated with magnetic and dielectric materials to create a magnetic shell around the wires as part of a manufacturing process to create inductive devices. In the present embodiment, after magnetic shells 1903 have been deposited onto each pair of insulated wires 1902, mold compound 1904 is applied to a group of inductive devices 1903 on wire carrier 1901. As used and described herein, "mold compound" refers to any suitable substance that may be used to encapsulate a semiconductor chip or other types of electronic components, such as, for example, capacitors, resistors, and transistors. Mold compound 1904 may correspond to a plastic or epoxy resin substance that is applied in a liquid state and subsequently hardens to a solid, in response to thermal conditions or a chemical reaction.

As illustrated, a gap is evident between mold compound 1904 and wire carrier 1901. In other embodiments, mold compound 1904 may be applied to inductive devices 1903 up to the edges of wire carrier 1901, and may come into contact with wire carrier 1901. Upon mold compound 1904 reaching a hardened state, a portion of mold compound 1904 may be removed between inductive devices 1903. At such a stage, each inductive device 1903 may correspond to phase 11(b) in FIG. 11, and phases 11(c) and 11(d) may be performed while inductive devices 1903 remain attached to wire carrier 1901, eventually leading to phase 11(e) with individual inductors.

It is noted that FIG. 19 is merely an example. Although five inductive devices 1903 are shown, any suitable number may be included on a given wire carrier. Although wire carrier 1901 is illustrated with only three sides, a fourth side may be included on the open end along the dashed lines, forming a rectangular shape.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An inductive device, comprising:
   a first wire coupled to a first terminal and to a second terminal;
   a second wire adjacent to the first wire;
   a non-conductive material surrounding the first wire and the second wire, wherein the non-conductive material spans a region between the first terminal and the second terminal, and wherein the non-conductive material isolates the first wire from the second wire; and
   a magnetic film surrounding at least a portion of the non-conductive material between the first terminal and the second terminal, wherein:
   the magnetic film includes an upper indention on the top of the inductive device and a lower indention on the bottom of the inductive device;
   the magnetic film in the upper and lower indentions does not come into contact;
   the upper and lower indentions run parallel to the first wire and the second wire; and
   the first wire has a first amount of inductance.

2. The inductive device of claim 1, wherein at least a portion of the upper and lower indentions lie between the second wire and the first wire.

3. The inductive device of claim 1, wherein, as viewed in a cross section of the inductive device, a shortest distance across the magnetic film between the first wire and the second wire is less than a distance across the magnetic film through either the first wire or the second wire.

4. The inductive device of claim 1, wherein the second wire is coupled to a third terminal and to a fourth terminal.

5. The inductive device of claim 4, wherein the first amount of inductance is modified dependent upon a current through the second wire between the third terminal and the fourth terminal.

6. The inductive device of claim 4, wherein the first wire and the second wire are twisted around each other such that the first terminal and the fourth terminal are on a same side of the inductive device.

7. The inductive device of claim 1, wherein a third wire is coiled around the magnetic film and wherein the third wire is coupled to a third terminal and to a fourth terminal.

8. A system comprising:
   an integrated circuit including:
      a first bond pad; and
      a second bond pad; and
   an inductive device including:
      a first wire, wherein a first end of the first wire is coupled to the first bond pad and a second end of the first wire is coupled to the second bond pad;
      a second wire adjacent to the first wire;
      a non-conductive material surrounding the first wire and the second wire, wherein the non-conductive material spans a region between the first end of the first wire and the second end of the first wire, and wherein the non-conductive material isolates the first wire from the second wire; and
      a magnetic film surrounding at least a portion of the non-conductive material between the first end of the first wire and the second end of the first wire, wherein:
      the magnetic film includes an upper indention on the top of the inductive device and a lower indention on the bottom of the inductive device;
      the magnetic film in the upper and lower indentions does not come into contact;
      the upper and lower indentions run parallel to the first wire and the second wire; and
      wherein the first wire has a first amount of inductance.

9. The system of claim 8, wherein at least a portion of the upper and lower indentions lie between the second wire and the first wire.

10. The system of claim 8, wherein the integrated circuit includes a third bond pad and a fourth bond pad, and wherein a first end of the second wire is coupled to the third bond pad and a second end of the second wire is coupled to the fourth bond pad.

11. The system of claim 10, wherein the integrated circuit supplies a current through the second wire, and wherein an amount of the current determines a second amount of inductance of the first wire.

12. The system of claim 8, wherein the magnetic film includes at least a first piece of magnetic film and a second piece of magnetic film, and wherein the first and second pieces of the magnetic film are separated by a dielectric material.

13. The system of claim 12, wherein a length of the first piece of magnetic film and a length of the second piece of magnetic film of the magnetic film are selected by the first amount of inductance of the first wire.

* * * * *